United States Patent
Chen et al.

(10) Patent No.: US 8,507,920 B2
(45) Date of Patent: Aug. 13, 2013

(54) SEMICONDUCTOR STRUCTURE AND METHOD OF FORMING THE SAME

(75) Inventors: Po-Chih Chen, Hsinchu (TW); Jiun-Lei Jerry Yu, Zhudong Township (TW); Fu-Wei Yao, Hsinchu (TW); Chun-Wei Hsu, Taichung (TW); Fu-Chih Yang, Fengshan (TW); Chun Lin Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/180,268

(22) Filed: Jul. 11, 2011

(65) Prior Publication Data

US 2013/0015460 A1 Jan. 17, 2013

(51) Int. Cl.
*H01L 29/778* (2006.01)
(52) U.S. Cl.
USPC .................................................. 257/76
(58) Field of Classification Search
USPC ............................................. 257/192, 194, 76
See application file for complete search history.

(56) References Cited

U.S. PATENT DOCUMENTS

| | | | |
|---|---|---|---|
| 2004/0227153 A1* | 11/2004 | Hirose et al. | 257/192 |
| 2005/0087763 A1* | 4/2005 | Kanda et al. | 257/192 |
| 2008/0237639 A1* | 10/2008 | Nanjo et al. | 257/194 |

OTHER PUBLICATIONS

Lee, Hyung-Seok, et al., "AlGaN/GaN High-Electron-Mobility Transistors Fabricated Through a Au-Free Technology", IEEE Electron Device Letters, vol. 32, No. 5, May 2011, pp. 623-625.

* cited by examiner

*Primary Examiner* — Thao P. Le
(74) *Attorney, Agent, or Firm* — Lowe Hauptman Ham & Berner, LLP

(57) ABSTRACT

An embodiment of the disclosure includes a semiconductor structure. The semiconductor structure includes a first III-V compound layer. A second III-V compound layer is disposed on the first III-V compound layer and different from the first III-V compound layer in composition. An interface is defined between the first III-V compound layer and the second III-V compound layer. A gate is disposed on the second III-V compound layer. A source feature and a drain feature are disposed on opposite side of the gate. Each of the source feature and the drain feature includes a corresponding metal feature at least partially embedded in the second III-V compound layer. A corresponding intermetallic compound underlies each metal feature. Each intermetallic compound contacts a carrier channel located at the interface.

20 Claims, 9 Drawing Sheets

SEMICONDUCTOR STRUCTURE AND METHOD OF FORMING THE SAME

TECHNICAL FIELD

The disclosure relates generally to a semiconductor structure and, more particularly, to a high electron mobility transistor (HEMT) and method for forming a high electron mobility transistor.

BACKGROUND

In semiconductor technology, due to its characteristics, III-V semiconductor compounds are used to form various integrated circuit devices, such as high power field-effect transistors, high frequency transistors, or high electron mobility transistors (HEMTs). HEMT is a field effect transistor incorporating a junction between two materials with different band gaps (i.e., a heterojunction) as the channel instead of a doped region, as is generally the case for MOSFET. HEMTs have a number of attractive properties including high electron mobility and the ability to transmit signals at high frequency, etc.

Despite the attractive properties noted above, a number of challenges known to the applicants exist in connection with developing III-V semiconductor compounds based devices. For example, it may be difficult to grow high quality gallium nitride materials on certain substrates, particularly silicon, due to property differences (e.g., lattice constant and thermal expansion coefficient) between the gallium nitride material and the substrate material. Also, it has been challenging to form gallium nitride material devices meeting the property requirements for certain applications.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

Figure 1A:
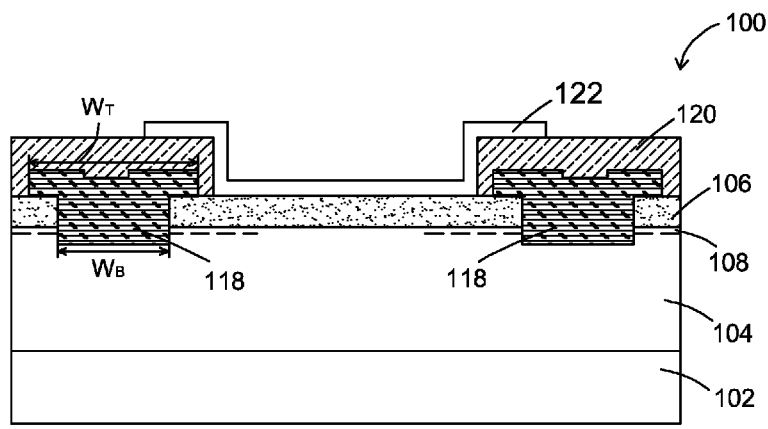
FIG. 1A is a cross-sectional view of a semiconductor structure having a high electron mobility transistor (HEMT) according to one embodiment of this disclosure.
Figure 1B:
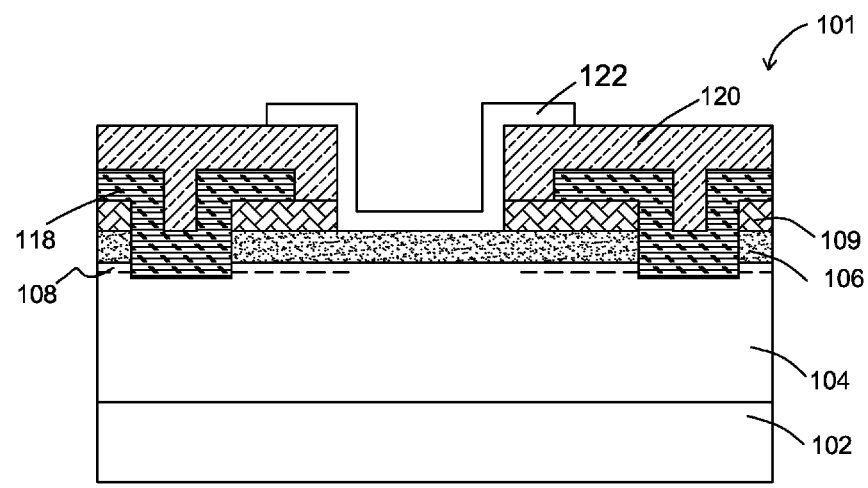
FIG. 1B is a cross-sectional view of a semiconductor structure having a HEMT according to another embodiment of this disclosure.
Figure 2:
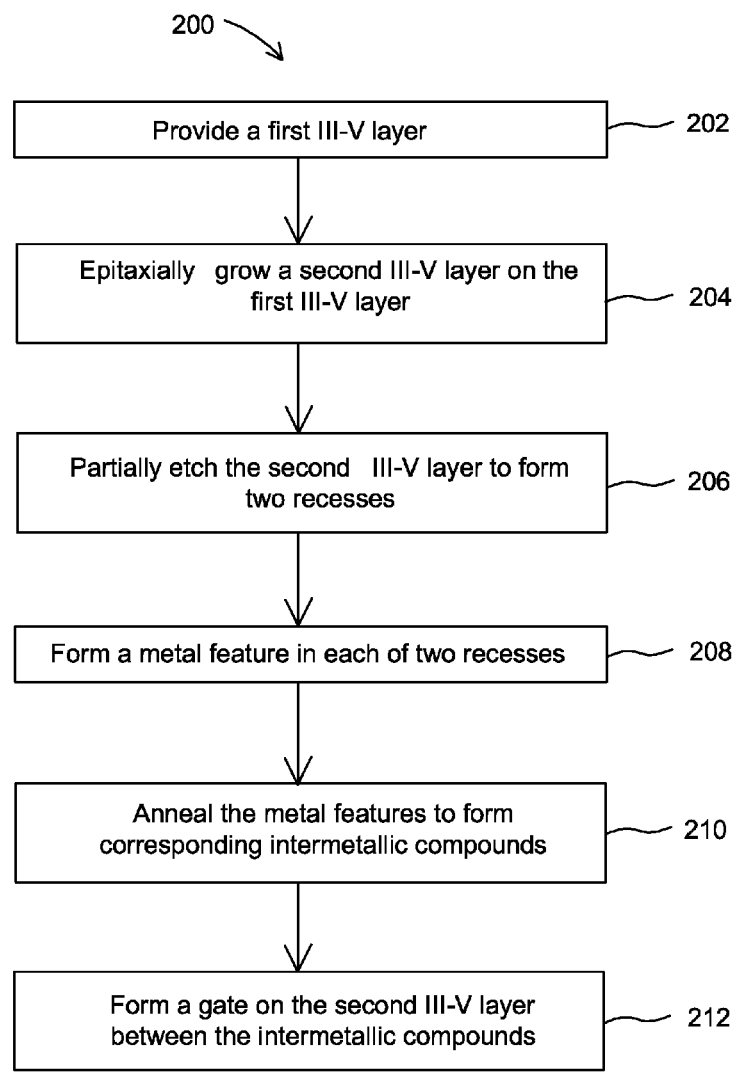
FIG. 2 is a flowchart of a method of forming a semiconductor structure having a HEMT according to one or more embodiments of this disclosure.

FIGS. 1A and 1B are cross-sectional views of semiconductor structures 100 and 101, each semiconductor structure having a high electron mobility transistor (HEMT) according to one or more embodiments of this disclosure. FIG. 2 is a flowchart of a method 200 of forming a semiconductor structure having a HEMT according to one or more embodiments of this disclosure. FIGS. 3 to 8 are cross-sectional views of the semiconductor structure 100 having a HEMT at various stages of manufacture according to one embodiment of the method 200 of FIG. 2. FIGS. 9 to 16 are cross-sectional views of the semiconductor structure 101 having a HEMT at various stages of manufacture according to another embodiment of the method 200 of FIG. 2. It should be noted that additional processes may be provided before, during, or after the method 200 of FIG. 2. Various figures have been simplified for a better understanding of the inventive concepts of the present disclosure.

Referring to FIG. 1A, the semiconductor structure 100 having a HEMT is illustrated. The semiconductor structure 100 includes a substrate 102. In some embodiments, the substrate 102 includes a silicon carbide (SiC) substrate, sapphire substrate or a silicon substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In at least one embodiment, the semiconductor structure 100 includes a first III-V compound layer (or referred to as a channel layer) 104 formed on the substrate 102 and a second III-V compound layer (or referred to as a donor-supply layer) 106 formed on the channel layer 104. The channel layer 104 and the donor-supply layer 116 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum gallium nitride (AlGaN) layer (also referred to as AlGaN layer 106). The GaN layer 104 and AlGaN layer 106 directly contact each other. In another example, the channel layer 104 includes a GaAs layer or InP layer. The donor-supply layer 106 includes an AlGaAs layer or a AlInP layer.

The GaN layer 104 is undoped. Alternatively, the GaN layer 104 is unintentionally doped, such as lightly doped with n-type due to a precursor used to form the GaN layer 104. In one example, the GaN layer 104 has a thickness in a range from about 0.5 micron to about 10 microns.

The AlGaN layer 106 is intentionally doped. In one example, the AlGaN layer 106 has a thickness in a range from about 5 nanometers (nm) to about 50 nanometers.

The band gap discontinuity exists between the AlGaN layer 106 and the GaN layer 104. The electrons from piezoelectric effect in the AlGaN layer 106 drop into the GaN layer 104, creating a very thin layer 108 of highly mobile conducting electrons in the GaN layer 104. This thin layer 108 is referred to as a two-dimensional electron gas (2-DEG), forming a carrier channel (also referred to as the carrier channel 108). The thin layer 108 of 2-DEG is located at an interface of the AlGaN layer 106 and the GaN layer 104. Thus, the carrier channel has high electron mobility because the GaN layer 104 is undoped or unintentionally doped, and the electrons can move freely without collision with the impurities or substantially reduced collision.

The semiconductor structure 100 also includes a source feature and a drain feature disposed on the AlGaN layer 106 and configured to electrically connect to the carrier channel 108. Each of the source feature and the drain feature comprises a corresponding intermetallic compound 118. The intermetallic compound 118 is at least partially embedded in the AlGaN layer 106 and a top portion of the GaN layer 104. In one example, the intermetallic compound 118 is free of Au and comprises Al, Ti, or Cu. In another example, the intermetallic compound 118 is free of Au and comprises AlN, TiN, $Al_3Ti$ or $AlTi_2N$.

The intermetallic compound 118 may be formed by constructing a patterned metal layer in a recess of the AlGaN layer 106. Then, a thermal annealing process may be applied to the patterned metal layer such that the metal layer, the AlGaN layer 106 and the GaN layer 104 react to form the intermetallic compound 118. The intermetallic compound 118 contacts the carrier channel 108 located at the interface of the AlGaN layer 106 and the GaN layer 104. Due to the formation of the recess in AlGaN layer 106, the metal elements in the intermetallic compound 118 may diffuse deeper into the AlGaN layer 106 and the GaN layer 104. The intermetallic compound 118 may improve electrical connection and form ohmic contacts between the source/drain features and the carrier channel 108. In one example, the intermetallic compound 118 is formed in the recess of the AlGaN layer 106 thereby the intermetallic compound 118 has a non-flat top surface. In another example, intermetallic compound 118 overlies a portion of the AlGaN layer 106. The intermetallic compound 118 has a top width $W_T$ and a bottom width $W_B$. The top width $W_T$ is wider than the bottom width $W_B$. In yet another example, intermetallic compound 118 does not overlie a portion of the AlGaN layer 106. The top width $W_T$ and the bottom width $W_B$ is substantially the same.

The semiconductor structure 100 also includes a gate 122 disposed on the AlGaN layer 106 between the source and drain features. The gate 122 includes a conductive material layer which functions as the gate electrode configured for voltage bias and electrical coupling with the carrier channel 108. In various examples, the conductive material layer may include a refractory metal or its compounds, e.g., tungsten (W), titanium nitride (TiN) and tantalum (Ta). In one example, the gate 122 is directly disposed on the AlGaN layer 106. In another example, a dielectric layer (not shown) is formed between the gate 122 and the AlGaN layer 106. The dielectric layer may include silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$) or hafnium oxide ($HfO_2$). The dielectric layer has a thickness in a range from about 3 nm to about 100 nm. The dielectric layer provides isolation to prevent gate leakage and further improve device switching speed.

The semiconductor structure 100 also includes an insulating layer 120 disposed between gate 122 and the source/drain features (namely the intermetallic compound 118). The insulating layer 120 covers the source/drain features and exposes a portion of the source/drain features to form functional circuitry. The gate 122 is at least partially embedded in the insulating layer 120.

FIG. 1B is a cross-sectional view of the semiconductor structure 101 having a HEMT according to another embodiment of this disclosure. The layer stacks of the semiconductor structure 101 are similar to the semiconductor structure 100 shown in FIG. 1A. However, the semiconductor structure 101 comprises a dielectric cap layer 109 disposed on a top surface of the AlGaN layer 106 not occupied by the gate 122 and intermetallic compounds 118. The dielectric cap layer 109 protects the underlying the AlGaN layer 106 from damage during the formation of a metal feature 114A (shown in FIG. 13). The metal feature 114A is used to form intermetallic compounds 118 in later processes. The electrical performances of the semiconductor structure 101 would be positively affected. Therefore, the yield of the overall assembly could increase.

In the above described embodiments, the gate 122, the source/drain features, and the carrier channel 108 in the GaN layer 104 are configured as a transistor. When a positive voltage is applied to the gate stack, a device current of the transistor could be modulated.

Referring now to FIG. 2, the flowchart of the method 200, at operation 202, a first III-V compound layer is provided. The first III-V compound layer is formed on a substrate. Next, the method 200 continues with operation 204 in which a second III-V compound layer epitaxially grows on the first III-V compound layer.

Figure 3:
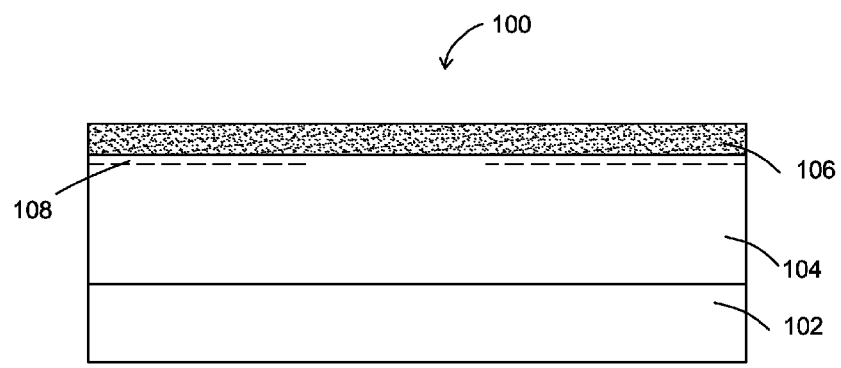
FIGS. 3 to 8 are cross-sectional views of a semiconductor structure having a HEMT at various stages of manufacture according to one embodiment of the method of FIG. 2.

Referring to FIG. 3, which is an enlarged cross-sectional view of a portion of a substrate 102 of a semiconductor structure 100 after performing operations 202 and 204. In some embodiments, the substrate 102 includes a silicon carbide (SiC) substrate, sapphire substrate or a silicon substrate. A first III-V compound layer 104, also refer to as a channel layer, is grown on the substrate 102. In this embodiment, the first III-V compound layer 104 refers to a gallium nitride (GaN) layer (also referred to as the GaN layer 104). The GaN layer 114 can be epitaxy grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. The GaN layer 104 has a thickness in a range from about 0.5 micron to about 10 microns. In other embodiments, the first III-V compound layer 104 may include a GaAs layer or InP layer.

A second III-V compound layer 106, also refer to as donor-supply layer, is grown on first III-V compound layer 104. An interface is defined between the first III-V compound layer 104 and the second III-V compound layer 106. A carrier channel 108 of 2-DEG is located at the interface. In at least one embodiment, the second III-V compound layer 106 refers to an aluminum gallium nitride (AlGaN) layer (also referred to as the AlGaN layer 106). The AlGaN layer 106 can be epitaxy grown on the GaN layer 104 by MOVPE using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical. The AlGaN layer 106 has a thickness in a range from about 5 nanometers to about 50 nanometers. In other embodiments, the second III-V compound layer 106 may include an AlGaAs layer, or AlInP layer.

Next back to FIG. 2, method 200 continues with operation 206 in which the second III-V compound layer is partially etched to form two recesses in the second III-V compound layer.

Figure 4:
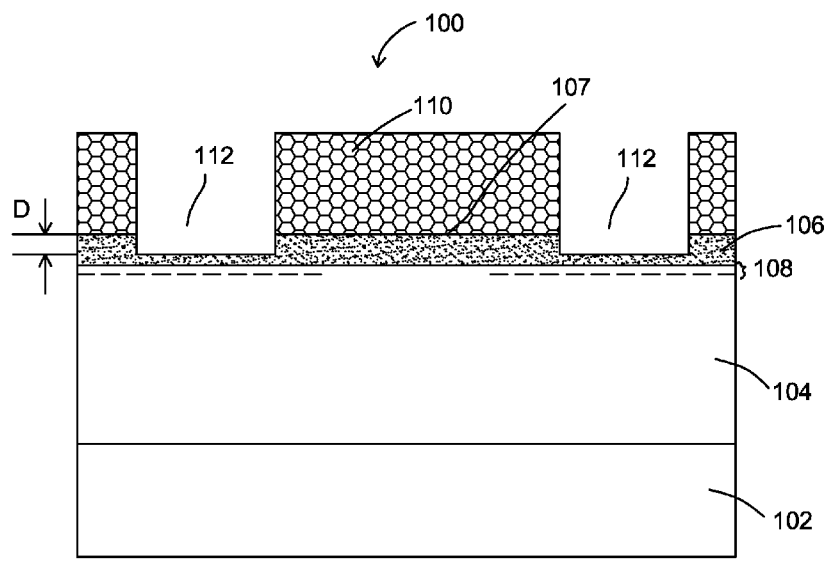

FIG. 4 is a cross-sectional view of the structure 100 after the performance of operation 206. A mask layer 110 is formed on a top surface 107 of the second III-V compound layer 106 and exposes two openings to define recesses. The mask layer 110 may be a hardmask comprising silicon nitride or a photo resist. Once formed, the mask layer 110 is patterned through suitable photolithographic and etching processes to form the openings and expose those portions of the top surface 107 of the second III-V compound layer 106.

The exposed portions of the second III-V compound layer 106 through the openings are removed by a suitable process such as reactive ion etching (RIE) in order to form two recesses 112 in the second III-V compound layer 106 (namely AlGaN layer 106). In at least one embodiment, the AlGaN layer 106 is etched with a plasma process, e.g., argon (Ar), chlorine ($Cl_2$) or boron trichloride ($BCl_3$) in a pressure at about 30 mTorr. In one example, the recess 112 extends to a depth D of about 10% to 100% of a thickness of the second III-V compound layer 106. In another example, the recess 112 further extends into the first III-V compound layer 104 (namely GaN layer 104) to a depth less than about 90% of a thickness of the second III-V compound layer 106. The mask layer 110 is removed after the formation of the recess 112. Advantageously, the recess 112 reduces the remaining thickness of the second III-V compound layer 106 after the etching operation 206. The metal elements in the intermetallic compound 118 (FIG. 7) formed in the later operation 210 may diffuse deeper into the second III-V compound layer 106 and the first III-V compound layer 104. The intermetallic compound 118 may improve electrical connection and form ohmic contacts between the source/drain features and the carrier channel 108. It is believed that the etching operation 206 on the second III-V compound layer 106 in the plasma environment creates nitrogen (N) vacancies in the second III-V compound layer 106 and the first III-V compound layer 104. The N vacancies increase carries so that the electrical performances for the device are improved.

Next back to FIG. 2, method 200 continues with operation 208 in which metal features are formed in the two recesses.

Figure 5:
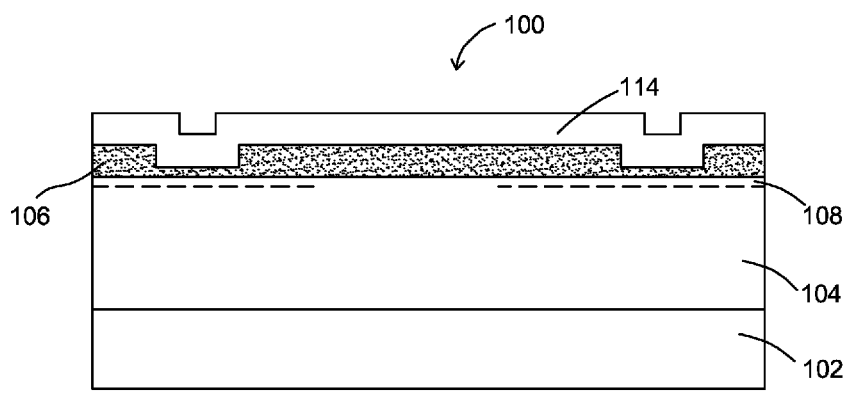

FIG. 5 is a cross-sectional view of the structure 100 after the performance of depositing a metal layer 114 over the second III-V compound layer 106 and overfilling the recesses 112. The metal layer 114 may include one or more conductive materials. In at least one example, the metal layer 114 is free of gold (Au) and comprises titanium (Ti), titanium nitride (TiN) or aluminum copper (AlCu) alloy. In another example, the metal layer 114 includes a bottom Ti/TiN layer, an AlCu layer overlying the bottom Ti/TiN layer and a top Ti layer overlying the AlCu layer. The bottom Ti/TiN layer has a thickness in a range from about 100 angstroms (Å) to about 1000 Å. The AlCu layer has a thickness in a range from about 100 Å to about 5000 Å. The top Ti layer has a thickness in a range from about 100 Å to about 1000 Å. The formation methods of the metal layer 114 include atomic layer deposition (ALD) or physical vapor deposition (PVD) processes.

Figure 6:
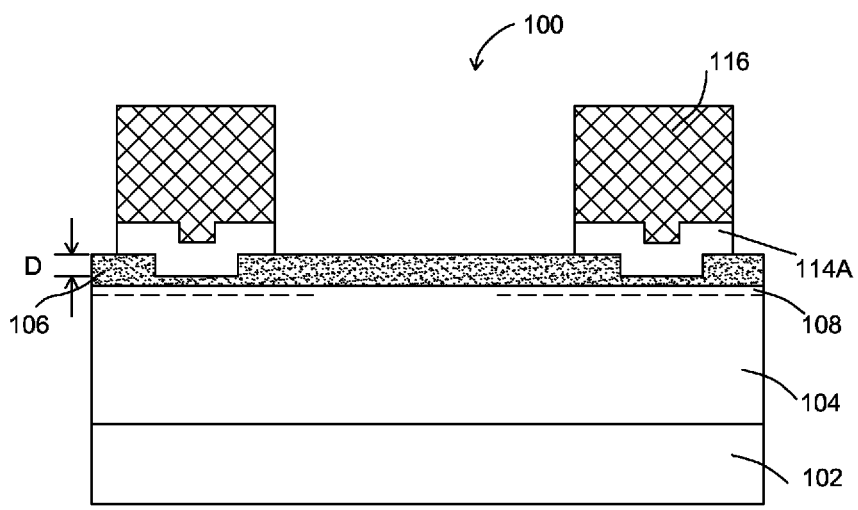

FIG. 6 is a cross-sectional view of the structure 100 after the performance of an etching process on the metal layer 114. A photoresist layer 116 is formed over the metal layer 114 and developed to form a feature over the recess 112. The metal layer 114 not covered by the feature of the photoresist layer 116 is removed by a reactive ion etch (RIE) process that etches the exposed portions of the metal layer 114 down to the underlying second III-V compound layer 106. A metal feature 114A over the recess 112 is generated after the etching process. In one example, the metal feature 114A is disposed over the interior surface of the recess 112 and contacts a bottom surface of the recess 112. In another example, the metal feature 114A also overlies a portion of the top surface 107 of the second III-V compound layer 106. There is a step height difference D between the top surfaces 107 and the bottom surface of the recess 112. The metal feature 114A is on both the recess 112 and the top surface 107 of the second III-V layer 106. The metal feature 114A has a non-flat top surface. The photoresist layer 116 is removed after the formation of the metal feature 114A.

Next back to FIG. 2, method 200 continues with operation 210 in which metal features are annealed to form corresponding intermetallic compounds.

Figure 7:
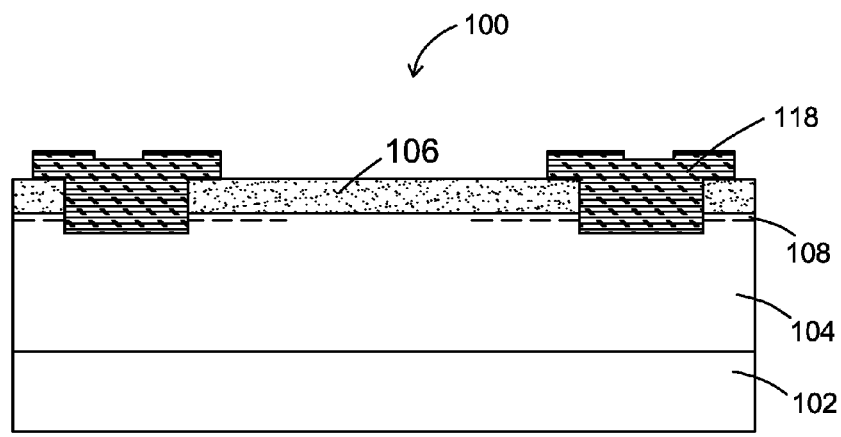

FIG. 7 is a cross-sectional view of the structure 100 after the performance of operation 210 on the metal feature 114A. A thermal annealing process may be applied to the metal feature 114A such that the metal feature 114A, the second III-V layer 106 and the first III-V layer 104 react to form an intermetallic compound 118. The intermetallic compound 118 is configured as an source/drain feature for effective electrical connection to the carrier channel 108. As one example, a rapid thermal annealing (RTA) apparatus and process are utilized for the thermal annealing. The thermal annealing is operated at an annealing temperature in a range between about 800° C. and about 1100° C. Due to the formation of the recess 112 in the second III-V compound layer 106, the metal elements in the intermetallic compound 118 may diffuse deeper into the second III-V compound layer 106 and the first III-V compound layer 104. The intermetallic compound 118 may improve electrical connection and form ohmic contacts between the source/drain feature and the carrier channel 108. In one example, the intermetallic compound 118 is free of Au and comprises Al, Ti, or Cu. In another example, the intermetallic compound 118 is free of Au and comprises AlN, TiN, $Al_3Ti$ or $AlTi_2N$.

Next back to FIG. 2, method 200 continues with operation 212 in which a gate is formed between the intermetallic compounds.

Figure 8:
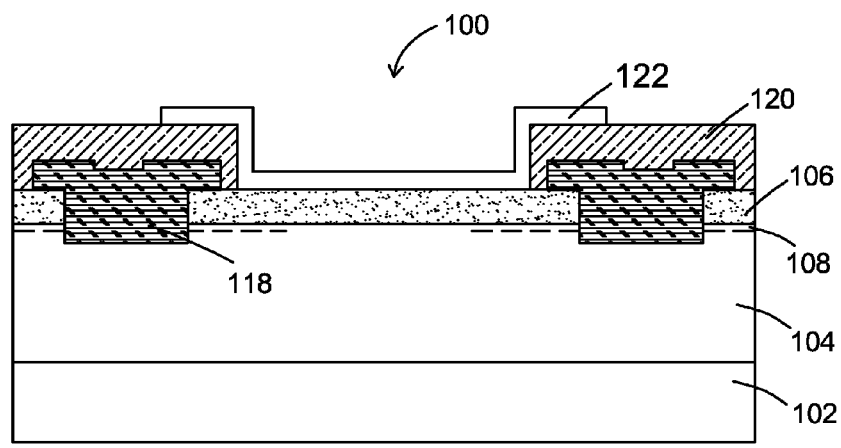

Before the formation of the gate, as shown in FIG. 8, an insulation layer 120 is deposited on the source/drain features and the second III-V compound layer 106 of the structure 100. A portion of the insulation layer 120 is removed by etching to expose a portion the second III-V layer compound 106.

After the performance of operation 212, a gate 122 is formed in FIG. 8. The gate 122 disposed on the second III-V compound layer 106 between the source and drain features. The gate 122 includes a conductive material layer that may include a refractory metal or its compounds, e.g., tungsten (W), titanium nitride (TiN) and tantalum (Ta). In one example, the gate 122 is directly disposed on the second III-V compound layer 106. In another example, a dielectric layer (not shown) is formed between the gate 122 and the second III-V compound layer 106. The dielectric layer may include silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$) or hafnium oxide ($HfO_2$). The dielectric layer has a thickness in a range from about 3 nm to about 100 nm. The dielectric layer provides isolation to prevent gate leakage and further improve device switching speed FIGS. 9 to 16 are cross-sectional views of the semiconductor structure 101 having a HEMT at various stages of manufacture according to another embodiment of the method 200 of FIG. 2. The layer stacks of forming the semiconductor structure 101 are similar to the forming the semiconductor structure 100. However, the semiconductor structure 101 further comprises a dielectric cap layer 109, at least a portion of the dielectric cap layer 109 is sandwiched by a portion of the intermetallic compounds 118 and a top surface of the second III-V compound layer 106.

Figure 9:
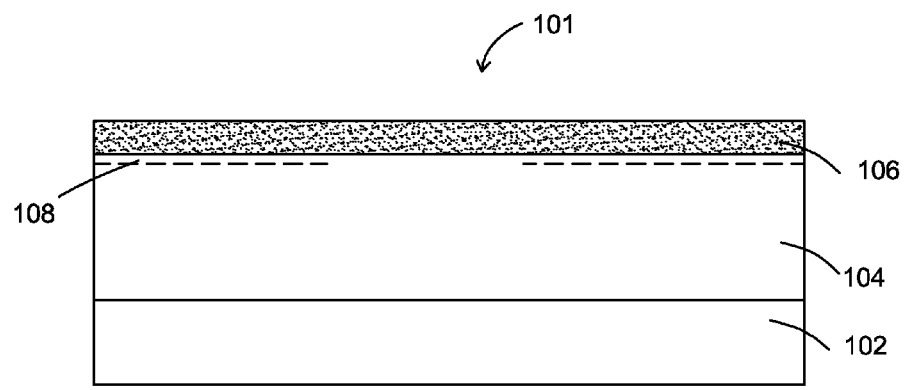
FIGS. 9 to 16 are cross-sectional views of a semiconductor structure having a HEMT at various stages of manufacture according to another embodiment of the method of FIG. 2.

The method 200 of forming the semiconductor structure 101 begins at operations 202 and 204. A first III-V compound layer 104 is formed on a substrate 102. A second III-V compound layer 106 epitaxially grows on the first III-V compound layer 104. The semiconductor structure 101 is shown in FIG. 9. Details of these operations can be found in text associated with the method 200 for the semiconductor structure 100 and are not repeated here.

Figure 10:
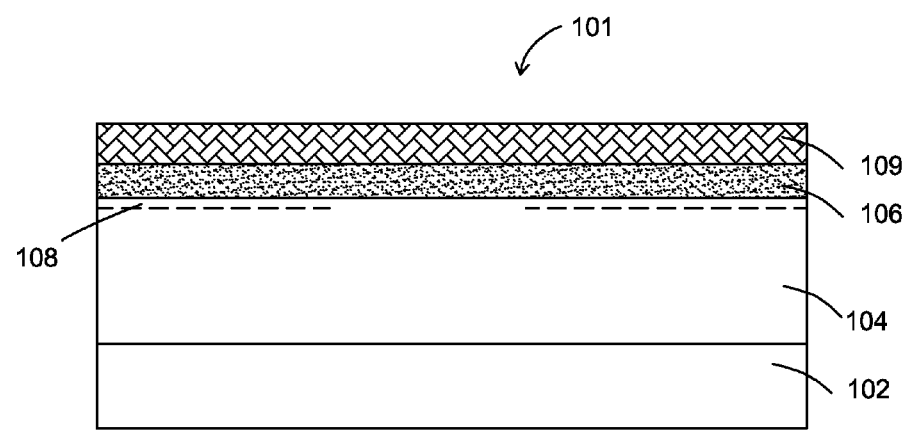

FIG. 10 is a cross-sectional view of the structure 101 after depositing a dielectric cap layer 109 on the second III-V layer 106. The dielectric cap layer 109 has a thickness in a range from about 100 Å to about 5000 Å. The dielectric cap layer 109 may include $SiO_2$ or $Si_3N_4$. In one example, the dielectric cap layer 109 is $Si_3N_4$ and formed by performing a chemical vapor deposition (CVD) method using $SiH_4$ and $NH_3$ gases. An operation temperature is in a range of from about 650° C. to about 800° C. An operation pressure is in a range of about 0.1 Torr and about 1 Torr.

Figure 11:
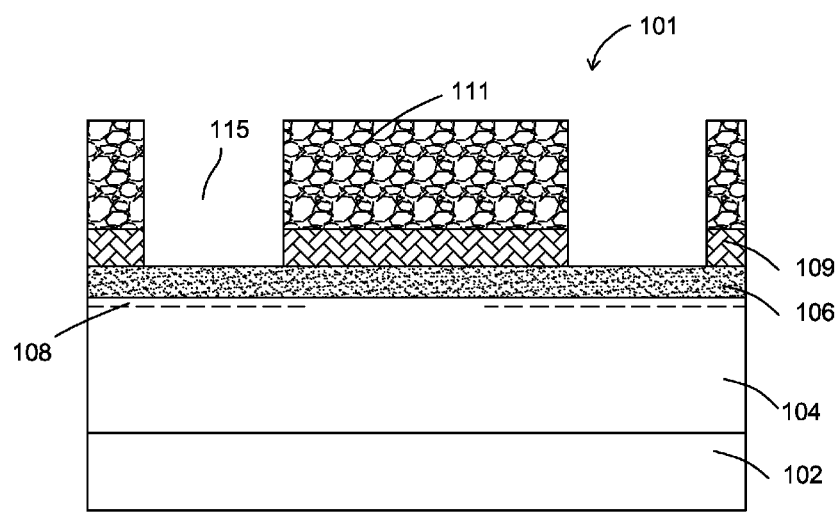

FIG. 11 is a cross-sectional view of the structure 101 after etching the dielectric cap layer 109. A patterned mask layer 111 is formed on the dielectric cap layer 109 and two openings 115 are defined to expose a portion of the dielectric cap layer 109. The exposed portions of the dielectric cap layer 109 are etched and the underlying the second III-V compound layer 106 is exposed through the openings 115.

Figure 12:
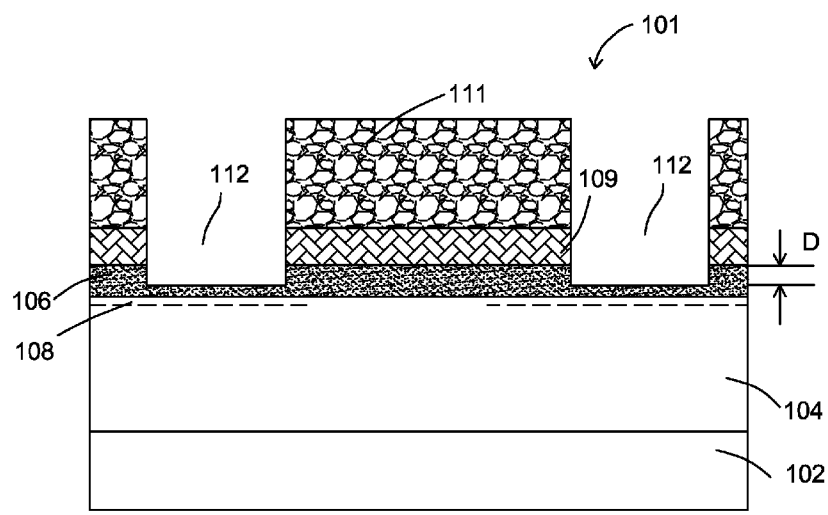

The method 200 of forming the semiconductor structure 101 continues with operation 206, which is illustrated in FIG. 12. The exposed portions of the second III-V compound layer 106 through the openings 115 are at least partially removed to form two recesses 112 in the second III-V compound layer 106. Details of this operation can be found in text associated with the method 200 for the semiconductor structure 100 and are not repeated here.

Figure 13:
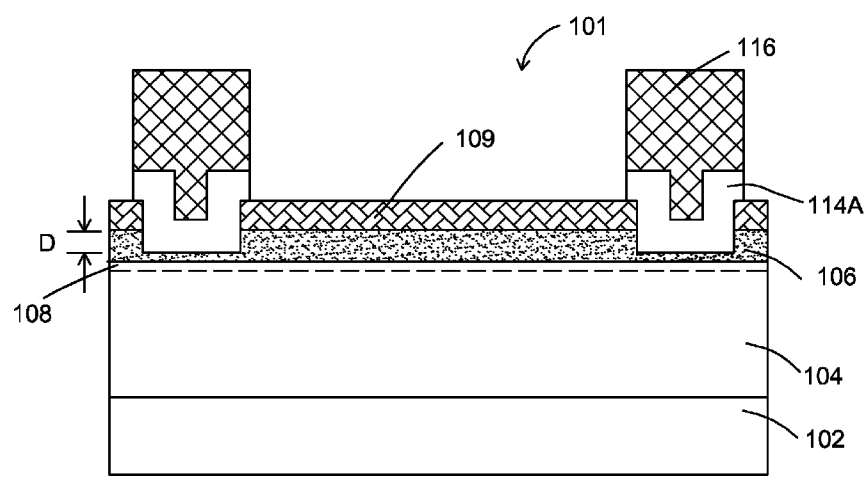

The method 200 of forming the semiconductor structure 101 continues with operation 208, which is illustrated in FIG. 13. A metal layer is deposed over the dielectric cap layer 109 and overfills the combined opening comprising the opening in the dielectric cap layer 109 and the recesses 112 in the in the second III-V compound layer 106. A photoresist layer 116 is formed over the metal layer 114 and developed to form a feature over the combined opening. The metal layer not covered by the feature of the photoresist layer 116 is removed by a reactive ion etch (RIE) process that etches the exposed portions of the metal layer down to the underlying the dielectric cap layer 109. A metal feature 114A over the combined opening, also the recess 112, is generated after the etching process. The photoresist layer 116 is removed after the formation of the metal feature. The dielectric cap layer 109 protects the underlying the second III-V compound layer 106 from damage during the etching process to form the metal feature 114A. The carriers in carrier channel 108 of 2-DEG underlying the second III-V compound layer 106 would not be affected. The electrical performances of the semiconductor structure 101 would be positively affected. Therefore, the yield of the overall assembly could increase.

In one example, the metal feature 114A is disposed over the interior surface of the recess 112 and contacts a bottom surface of the recess 112. In another example, the metal feature 114A is also disposed over the interior surface of the opening in the dielectric cap layer 109 and overlies a portion of the top surface of the dielectric cap layer 109. Details of the metal feature 114A can be found in text associated with the method 200 for the semiconductor structure 100 and are not repeated here.

Figure 14:
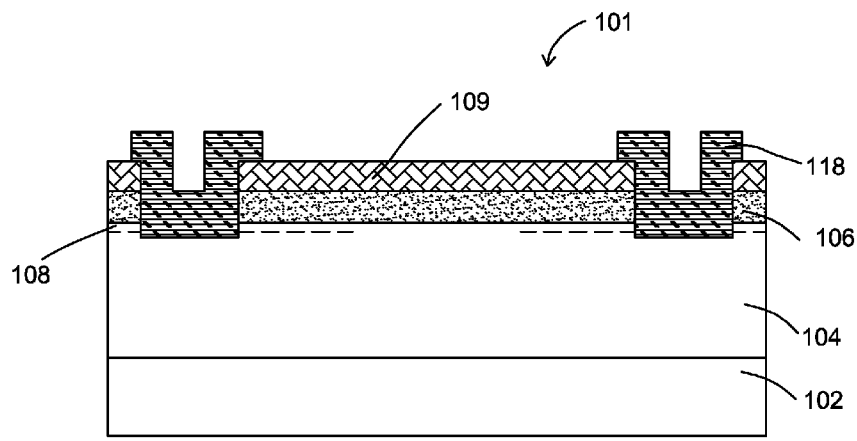

The method 200 of forming the semiconductor structure 101 continues with operation 210, which is illustrated in FIG. 14. A thermal annealing process may be applied to the metal feature 114A such that the metal feature 114A, the second III-V compound layer 106 and the first III-V compound layer 104 react to form an intermetallic compound 118. Details of this operation can be found in text associated with the method 200 for the semiconductor structure 100 and are not repeated here.

Figure 15:
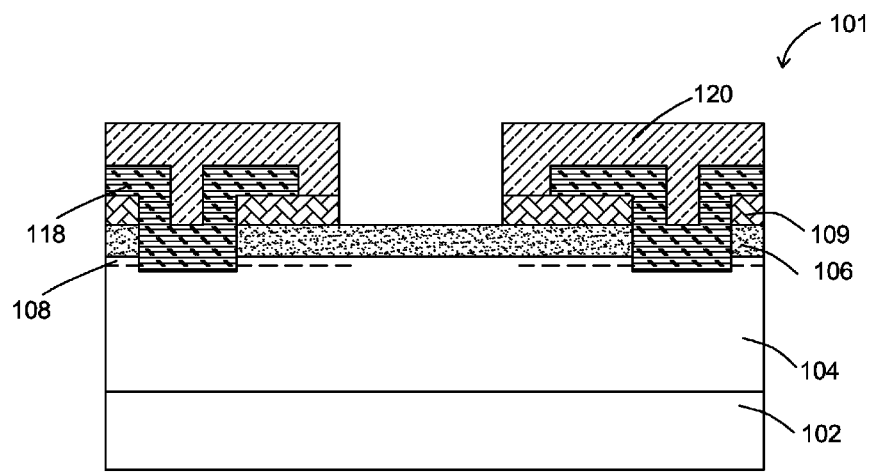

Referring to FIG. 15, an insulation layer 120 is deposited on the source/drain features (namely intermetallic compound 118) and the dielectric cap layer 109 of the structure 101. A portion of the insulation layer 120 and the dielectric cap layer 109 are removed by etching to expose a portion the second III-V compound layer 106.

Figure 16:
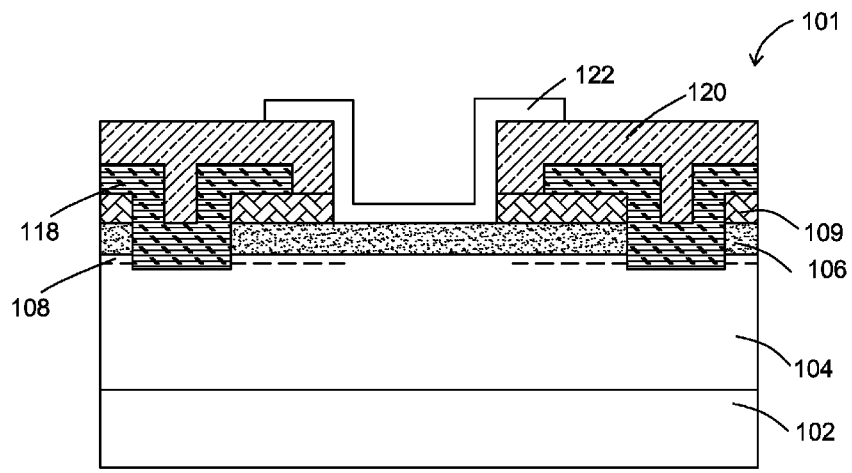

The method 200 of forming the semiconductor structure 101 continues with operation 212, which is illustrated in FIG. 16. In one example, the gate 122 directly disposed on the second III-V compound layer 106 between the source and drain features. In another example, a dielectric layer (not shown) is formed between the gate 122 and the second III-V compound layer 106. Details of this operation can be found in text associated with the method 200 for the semiconductor structure 100 and are not repeated here.

Various embodiments of the present invention may be used to improve the performance of a semiconductor structure having a high electron mobility transistor (HEMT). For example, the intermetallic compound 118 formed in the recess 112 may improve electrical connection and form ohmic contacts between the source/drain features and the carrier channel 108. The intermetallic compound 118 is free of Au and comprises Al, Ti or Cu. Without using Au in the intermetallic compound 118, the method 200 could also be implemented in the production line of integrated circuits on silicon substrate. The contamination concern from Au on the silicon-Fab process could be eliminated. Compared with the HEMT with Au in source/drain feature, the cost for manufacturing the HEMT according to the present application is reduced. Both the III-V semiconductor compounds process and the silicon-Fab process can be implemented in the same production line. It increases the flexibility to allocate different products for the production line.

An embodiment of the disclosure describes a semiconductor structure. The semiconductor structure includes a first III-V compound layer. A second III-V compound layer is disposed on the first III-V compound layer and different from the first III-V compound layer in composition. An interface is defined between the first III-V compound layer and the second III-V compound layer. A gate is disposed on the second III-V compound layer. A source feature and a drain feature are disposed on opposite side of the gate. Each of the source feature and the drain feature comprises a corresponding intermetallic compound at least partially embedded in the second III-V compound layer. Each intermetallic compound is free of Au and comprises Al, Ti or Cu, and contacts a carrier channel located at the interface.

Another embodiment of the disclosure describes a semiconductor structure. The semiconductor structure includes a GaN layer disposed on a substrate. An AlGaN layer is disposed on the GaN layer. A gate is disposed on the AlGaN layer. A source feature and a drain feature are disposed on opposite side of the gate. Each of the source feature and the drain feature comprises a corresponding intermetallic compound at least partially embedded in the AlGaN layer. Each intermetallic compound has a non-flat top surface.

The present disclosure also describes an embodiment of a method of forming a semiconductor structure. The method includes providing a first III-V compound layer. A second III-V compound layer is epitaxially grown on the first III-V compound layer. An interface is defined between the first III-V compound layer and the second III-V compound layer. The second III-V compound layer is partially etched to form two recesses in the second III-V compound layer. A metal feature is formed in each of two recesses. The metal features are annealed to form corresponding intermetallic compounds. Each intermetallic compound contacts a carrier channel located at the interface. A gate is formed on the second III-V compound layer between the intermetallic compounds.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a first III-V compound layer;
   a second III-V compound layer disposed on the first III-V compound layer and different from the first III-V compound layer in composition, wherein an interface is defined between the first III-V compound layer and the second III-V compound layer;
   a gate disposed on an upper surface of the second III-V compound layer;
   a source feature and a drain feature disposed on opposite side of the gate, each of the source feature and the drain feature comprising a corresponding intermetallic compound at least partially embedded in the second III-V compound layer, wherein each of the intermetallic compounds is free of Au and comprises Al, Ti or Cu, and contacts a carrier channel located at the interface; and
   a dielectric cap layer over the upper surface of the second III-V compound layer, at least a portion of the dielectric cap layer being sandwiched between a portion of the intermetallic compounds and the second III-V compound layer.

2. The semiconductor structure of claim 1, wherein each intermetallic compound overlies a portion of the second III-V compound layer.

3. The semiconductor structure of claim 1, wherein each intermetallic compound is embedded in the second III-V compound layer and a top portion of the first III-V compound layer.

4. The semiconductor structure of claim 1, wherein each intermetallic compound has a non-flat top surface.

5. The semiconductor structure of claim 1, wherein each intermetallic compound is free of Au and comprises AN, TiN, Al$_3$Ti or AlTi$_2$N.

6. The semiconductor structure of claim 1, each intermetallic compound has a top width and a bottom width, the top width is wider than the bottom width.

7. The semiconductor structure of claim 1, wherein the second III-V compound layer has a thickness in a range from about 5 nm to about 50 nm.

8. The semiconductor structure of claim 1, wherein the gate comprises tantalum nitride (TiN) or tungsten (W).

9. The semiconductor structure of claim 1, wherein the second III-V compound layer comprises AlGaN, AlGaAs, or AlInP.

10. A semiconductor structure comprising:
    a gallium nitride (GaN) layer disposed on a substrate;
    an aluminum gallium nitride (AlGaN) layer disposed on the GaN layer;
    a gate disposed on an upper surface of the AlGaN layer;
    a source feature and a drain feature disposed on opposite side of the gate, each of the source feature and the drain feature comprising a corresponding intermetallic compound at least partially embedded in the AlGaN layer, wherein each intermetallic compound has a non-flat top surface; and
    a dielectric cap layer over the upper surface of the AlGaN layer, at least a portion of the dielectric cap layer being sandwiched between a portion of the intermetallic compounds and the AlGaN layer.

11. The semiconductor structure of claim 10, wherein each intermetallic compound overlies a portion of the AlGaN layer.

12. The semiconductor structure of claim 10, wherein each intermetallic compound has a top width and a bottom width, the top width is wider than the bottom width.

13. The semiconductor structure of claim 10, wherein each intermetallic compound is free of Au and comprises Al, Ti, or Cu.

14. The semiconductor structure of claim 10, wherein each intermetallic compound is free of Au and comprises AN, TiN, Al$_3$Ti or AlTi$_2$N.

15. The semiconductor structure of claim 10, each intermetallic compound is embedded in the AlGaN layer and a top portion of the GaN layer.

16. The semiconductor structure of claim 10, wherein the substrate comprises silicon, silicon carbide or sapphire.

17. The semiconductor structure of claim 10, wherein the AlGaN layer has a thickness in a range from about 5 nm to about 50 nm.

18. A method of forming a semiconductor structure, the method comprising:
    providing a first III-V compound layer;
    epitaxially growing a second III-V compound layer on the first III-V compound layer, wherein an interface is defined between the first III-V compound layer and the second III-V compound layer;
    partially etching the second III-V compound layer to form two recesses in the second III-V compound layer;
    forming two metal features each in a corresponding one of the two recesses;
    annealing the metal features to form corresponding intermetallic compounds, each of the intermetallic compounds contacting a carrier channel located at the interface; and
    forming a gate on the second III-V compound layer between the intermetallic compounds.

19. The method of claim 18, wherein the gate is formed on an upper surface of the second III-V compound layer, and the method further comprises:
    forming a dielectric cap layer over the upper surface of the AlGaN layer; and
    prior to the partially etching to form the two recesses in the second III-V compound layer, forming two openings in the dielectric cap layer corresponding to the two recesses in the second III-V compound layer,
    wherein the forming two metal features each in a corresponding one of the two recesses is performed in a manner to extend the two metal features over an upper surface of the dielectric cap layer.

20. The method of claim 19, wherein the annealing is performed at an annealing temperature ranging from about 800° C. to about 1100° C.

* * * * *